US011571989B1

(12) United States Patent
Zhang et al.

(10) Patent No.: US 11,571,989 B1
(45) Date of Patent: *Feb. 7, 2023

(54) BATTERY SIMULATION MODULE, AND BATTERY ANALYSIS TOOL FOR DETERMINING A BATTERY SOLUTION USING A BATTERY SIMULATION MODULE

(71) Applicant: CPS Technology Holdings LLC, New York, NY (US)

(72) Inventors: Zhenli Zhang, Glendale, WI (US); Zhihong Jin, Pewaukee, WI (US); Tom M. Watson, Plymouth, MI (US)

(73) Assignee: CPS Technology Holdings LLC, New York, NY (US)

( * ) Notice: Subject to any disclaimer, the term of this patent is extended or adjusted under 35 U.S.C. 154(b) by 2 days.

This patent is subject to a terminal disclaimer.

(21) Appl. No.: 16/939,311

(22) Filed: Jul. 27, 2020

Related U.S. Application Data

(63) Continuation of application No. 16/179,571, filed on Nov. 2, 2018, now Pat. No. 10,752,126.

(Continued)

(51) Int. Cl.
*B60L 50/16* (2019.01)
*B60L 58/12* (2019.01)
(Continued)

(52) U.S. Cl.
CPC ............. *B60L 58/12* (2019.02); *B60L 50/16* (2019.02); *G01R 31/006* (2013.01);
(Continued)

(58) Field of Classification Search
CPC ....... B60L 58/12; B60L 50/16; G01R 31/006; G01R 31/379; G01R 31/3842; H01M 10/486
See application file for complete search history.

(56) References Cited

U.S. PATENT DOCUMENTS

| 10,752,126 | B1 * | 8/2020 | Zhang | G01R 31/006 |
| 2012/0046776 | A1 * | 2/2012 | Zhang | H01M 10/052 700/106 |

(Continued)

FOREIGN PATENT DOCUMENTS

WO  2019204705 A1  10/2019

OTHER PUBLICATIONS

Rick, A. and Sisk, B., "A Simulation Based Analysis of 12V and 48V Microhybrid Systems Across Vehicle Segments and Drive Cycles," SAE Technical Paper, 2015-01-1151, 2015.
(Continued)

*Primary Examiner* — Nghia M Doan
(74) *Attorney, Agent, or Firm* — Boardman & Clark LLP

(57) ABSTRACT

A module-based framework evaluates designs of advanced start stop systems, particularly 12 V advanced start stop systems. The framework separates vehicle and battery analysis and uses a power profile to evaluate different designs of the vehicles and batteries. Particularly, the framework can evaluate different battery solutions and compare performances as a function of drive cycles, motor size, and electrical loads. In addition to modeling, actual batteries are tested for the same power inputs for validating performance differences. This framework identifies performance limiting components for determination of the vehicle system component optimization.

16 Claims, 11 Drawing Sheets

Related U.S. Application Data

(60) Provisional application No. 62/580,745, filed on Nov. 2, 2017.

(51) Int. Cl.
    *G01R 31/00*       (2006.01)
    *H01M 10/48*      (2006.01)
    *G01R 31/3842*    (2019.01)
    *G01R 31/379*     (2019.01)

(52) U.S. Cl.
    CPC ....... *G01R 31/379* (2019.01); *G01R 31/3842* (2019.01); *H01M 10/486* (2013.01)

(56) References Cited

U.S. PATENT DOCUMENTS

| | | |
|---|---|---|
| 2014/0216709 A1 | 8/2014 | Smith |
| 2016/0243947 A1 | 8/2016 | Perkins |
| 2016/0243958 A1 | 8/2016 | Miller |
| 2016/0372935 A1* | 12/2016 | Sakata ..................... H02J 7/00 |
| 2017/0225586 A1 | 8/2017 | Zhang |

OTHER PUBLICATIONS

Zhang, Z., Rick, A., and Sisk, B., "Model Development and Simulations of 12V Dual Batteries towards Design Optimization of Microhybrid Vehicles," SAE Technical Paper 2015-01-1199, 2015.

Zhang, Z., Jin, Z., and Wyatt, P., "Model-based evaluation of chemistry selection for dual energy storages for 12V advanced start stop vehicles," SAE Technical Paper 2016-01-1209, 2016.

Hu et al., Integrated Optimization of Battery Sizing, Charging, and Power Management in Plug-in Hybrid Electric Vehicles, Aug. 31, 2015 (Year: 2015).

\* cited by examiner

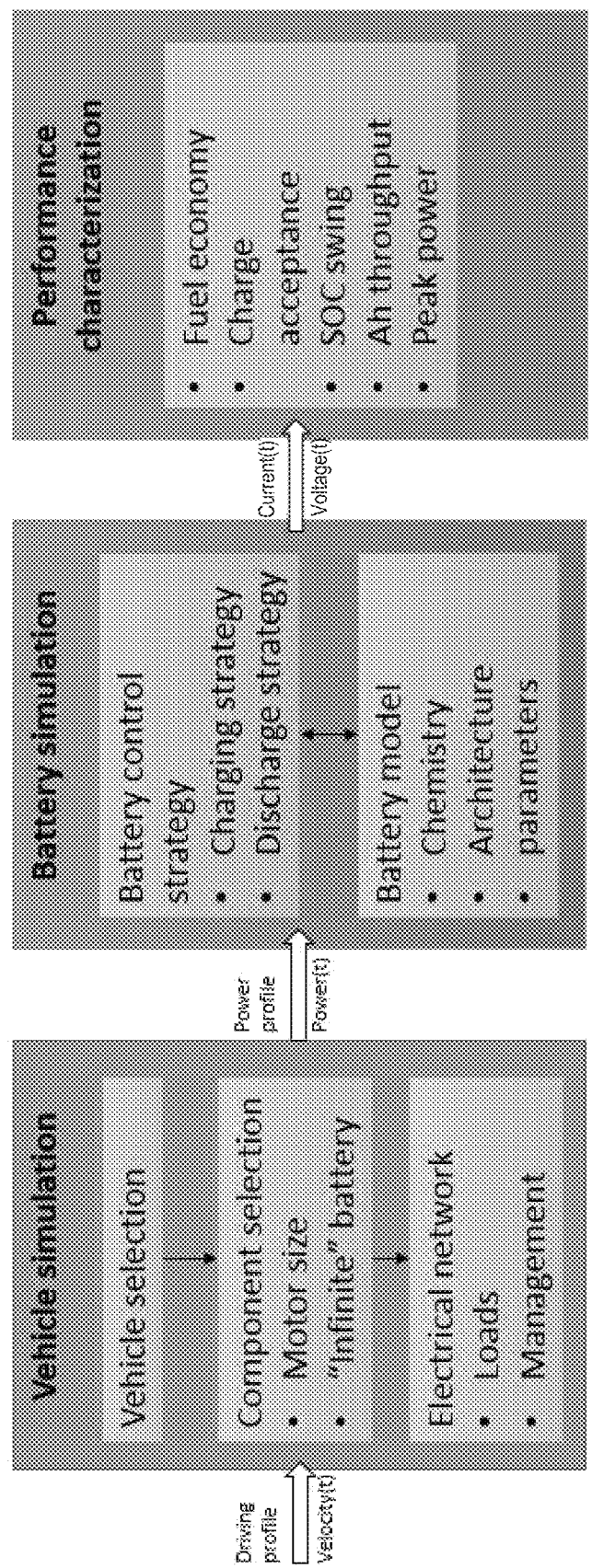
Figure 1: Module-based simulation tool for 12V advanced start stop system design.

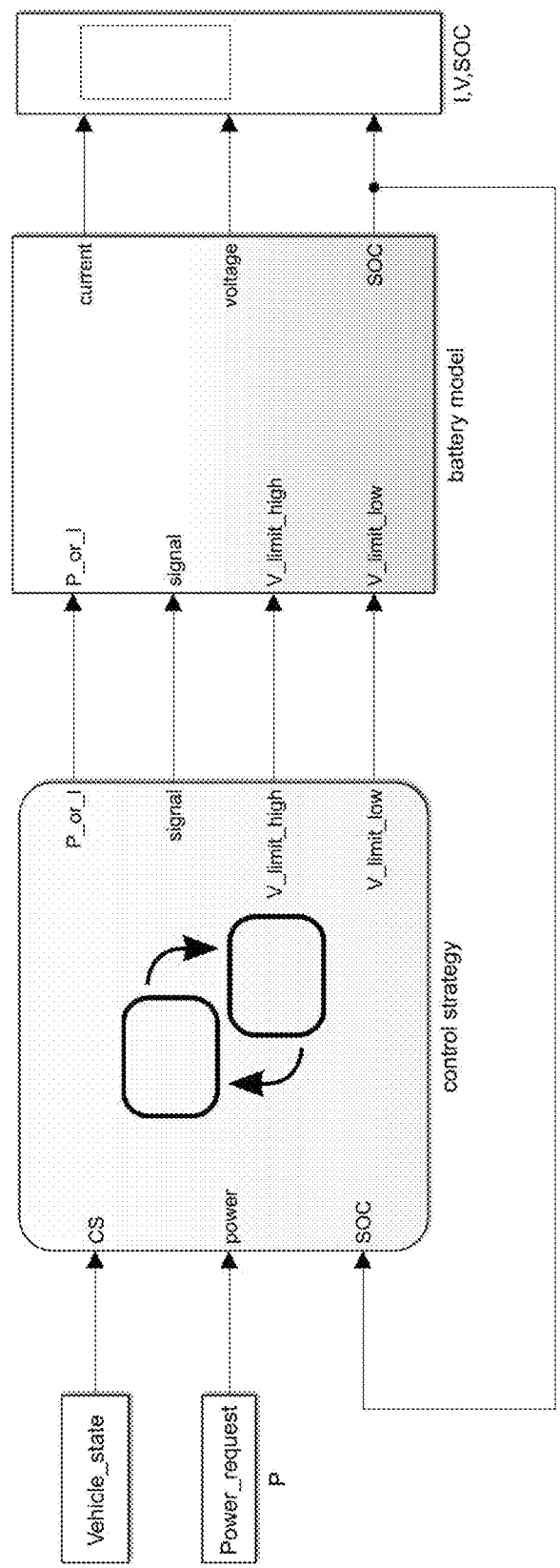
Figure 2: Matlab/Simulink interface of the battery simulation module.

Figure 3: The Autonomie software interface showing where parameters are modified to simulate a particular vehicle.
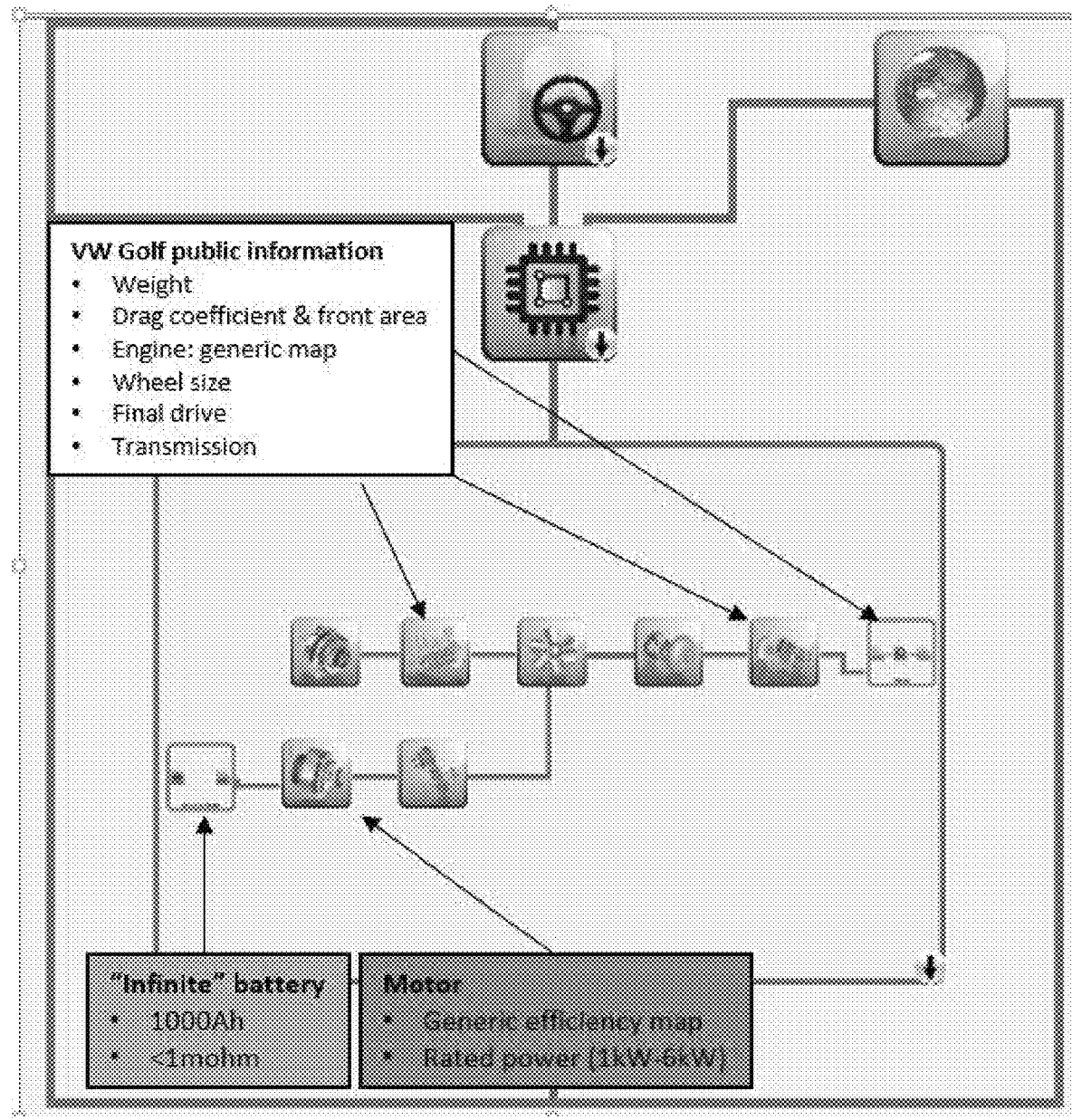

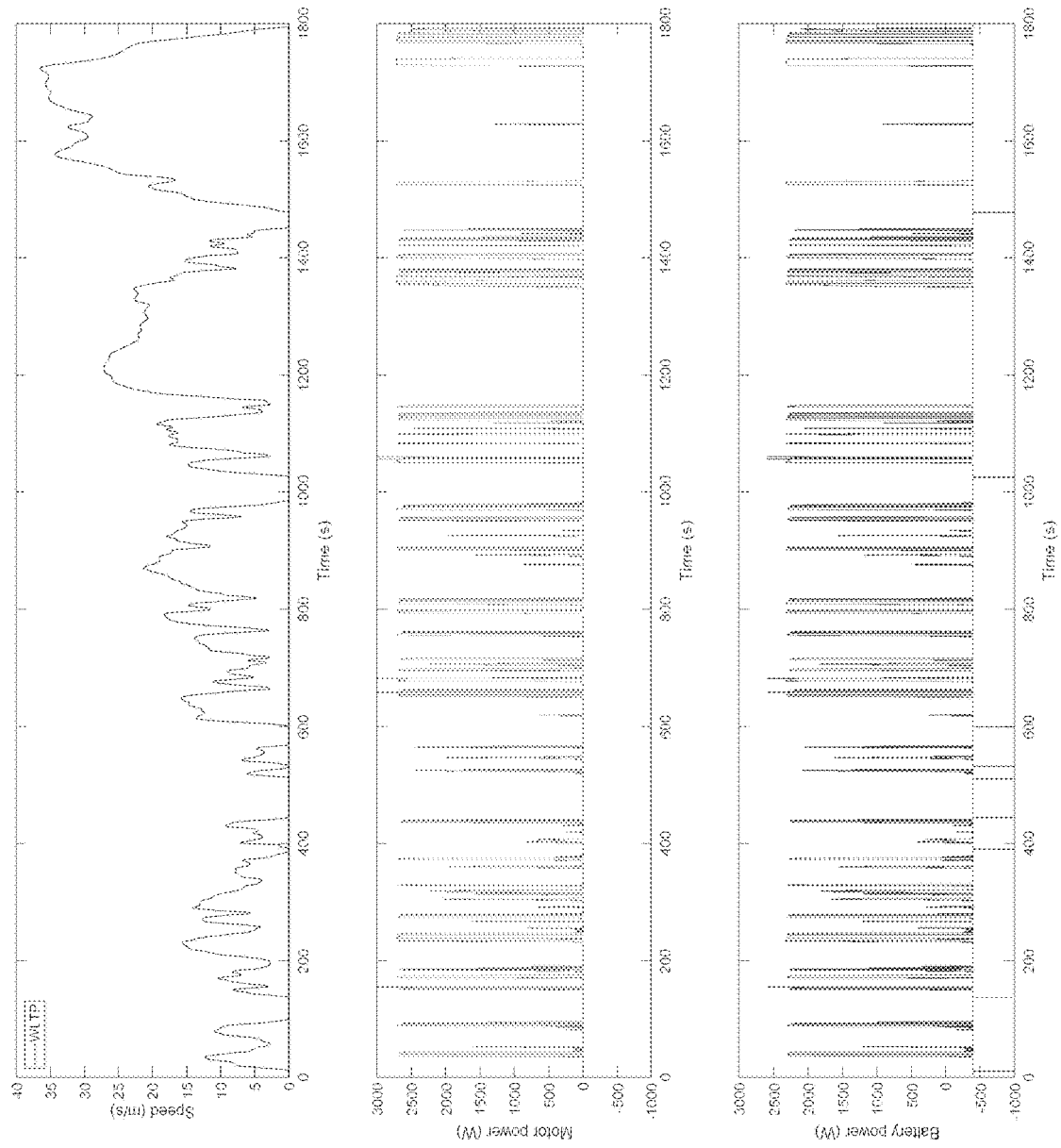

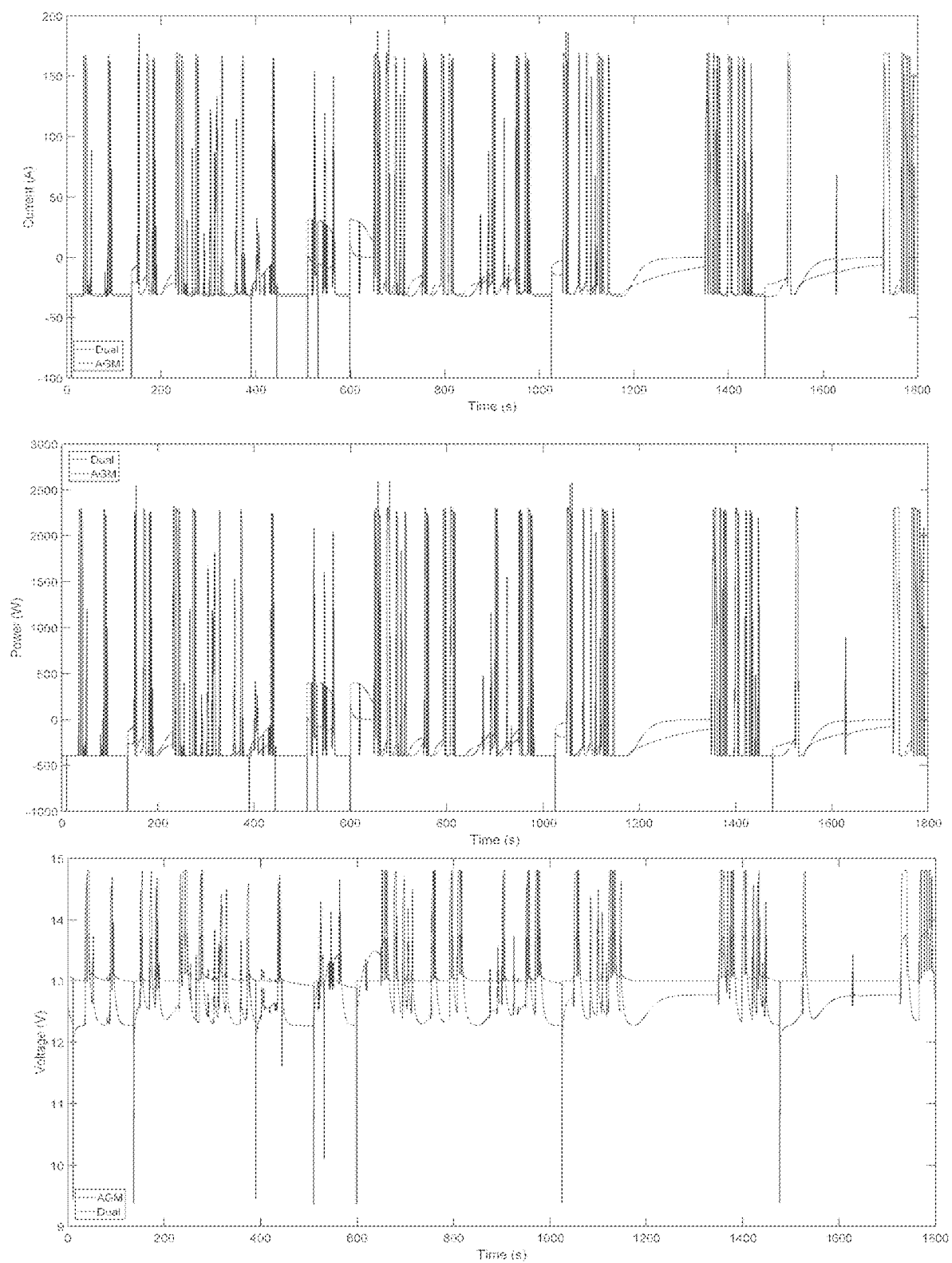
Figure 5: Simulation results of typical cases A and B.

Figure 6: Performance comparison of battery solutions for WLTP with 400W load.
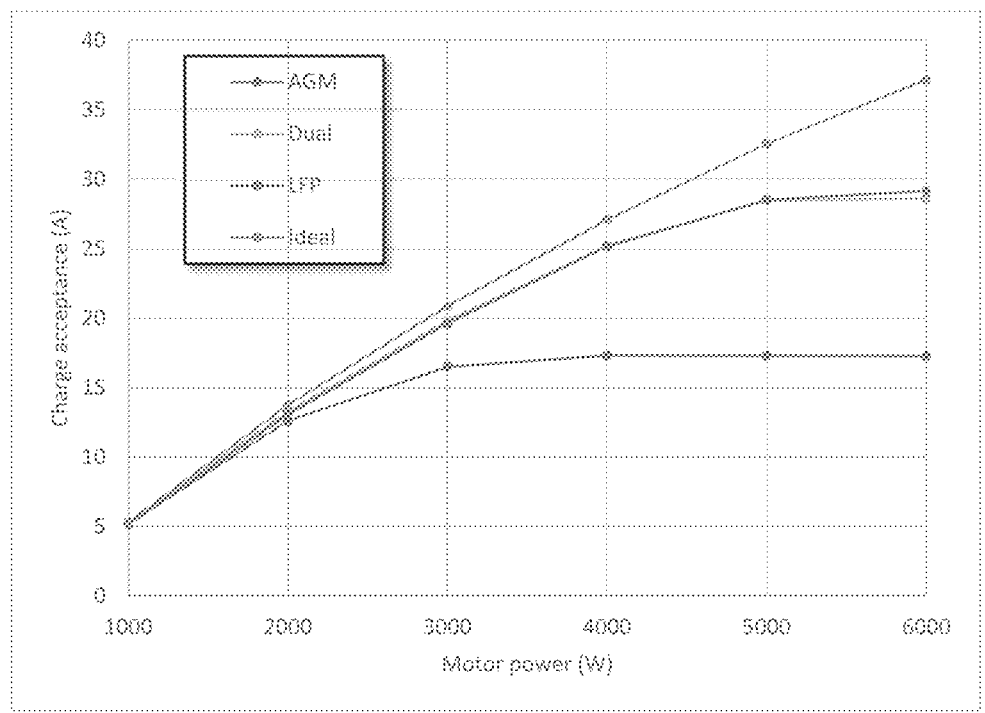
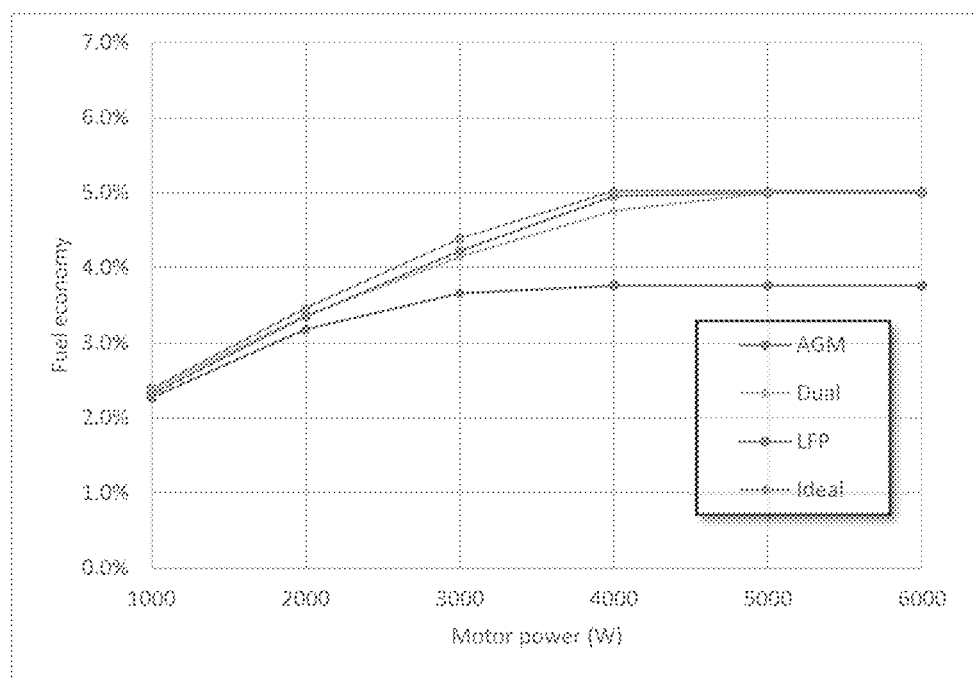

Figure 7: Performance comparison of battery solutions for WLTP with 800W load.
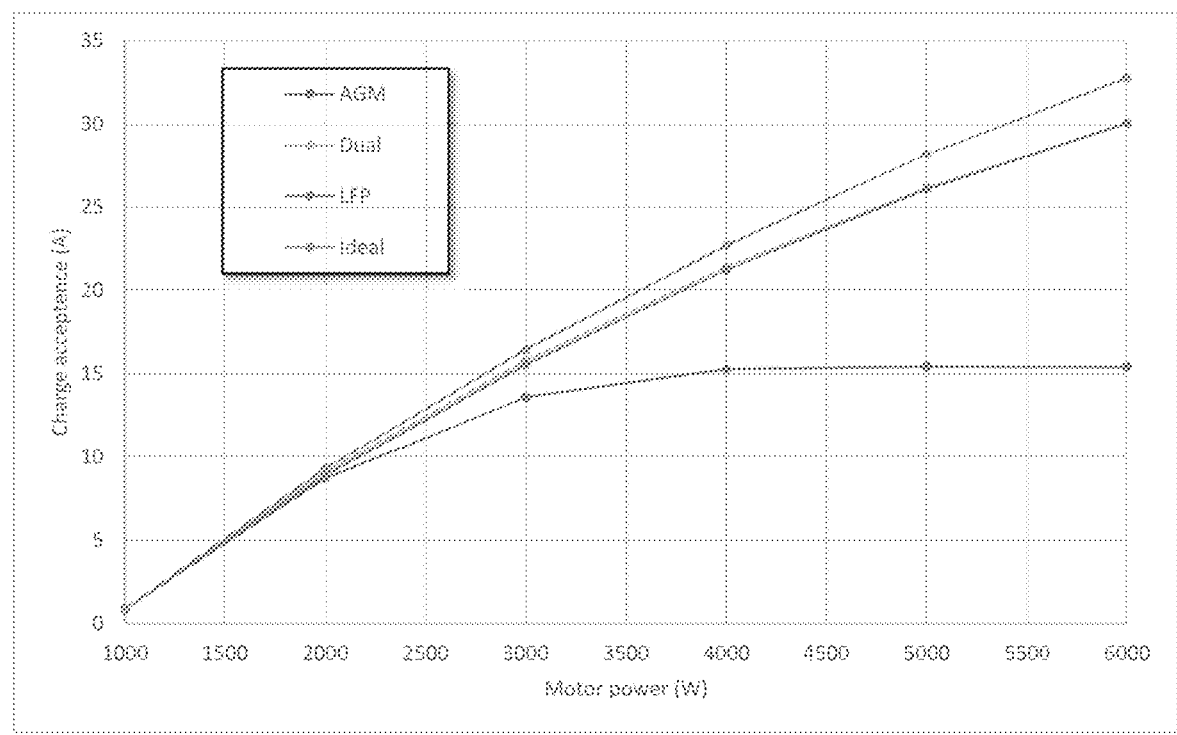
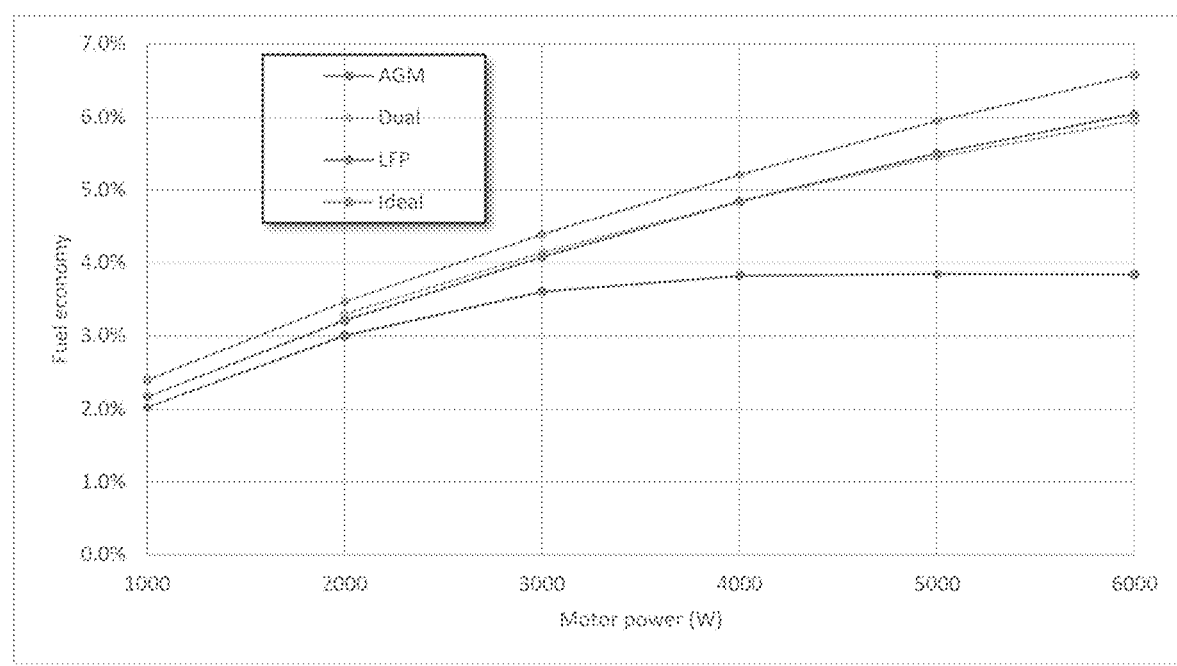

Figure 8: Performance comparison of battery solutions for NEDC with 400W.
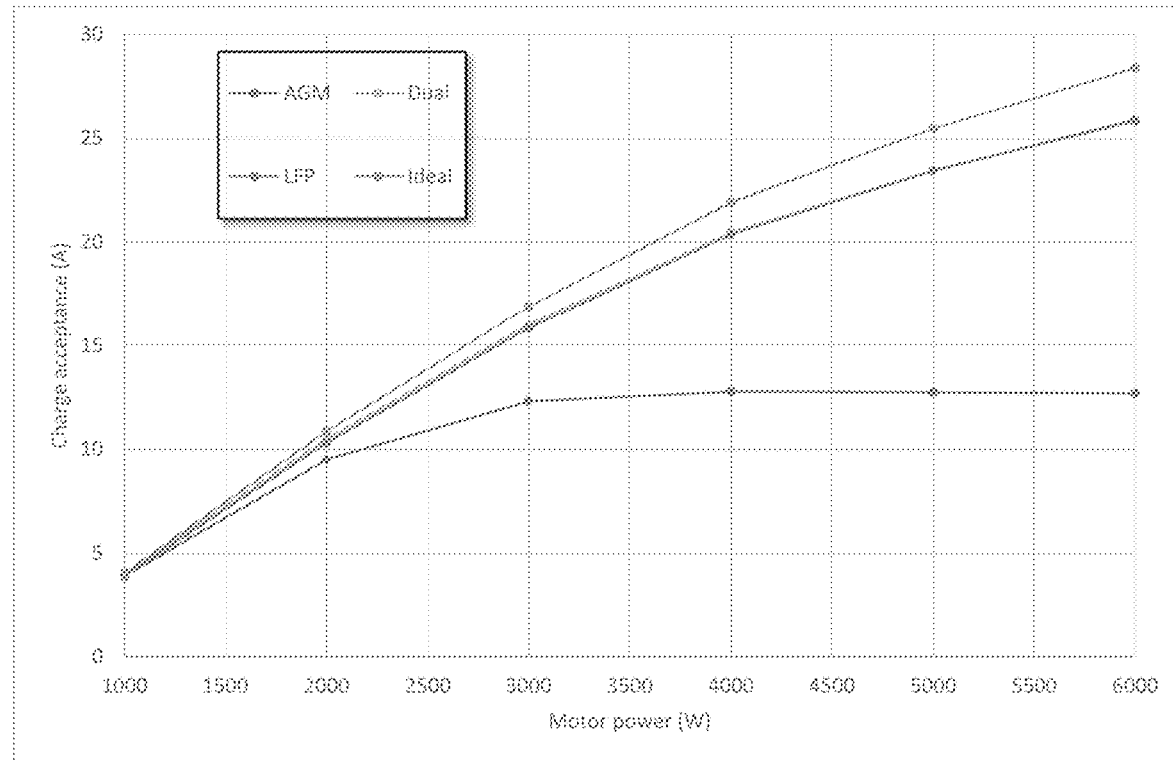
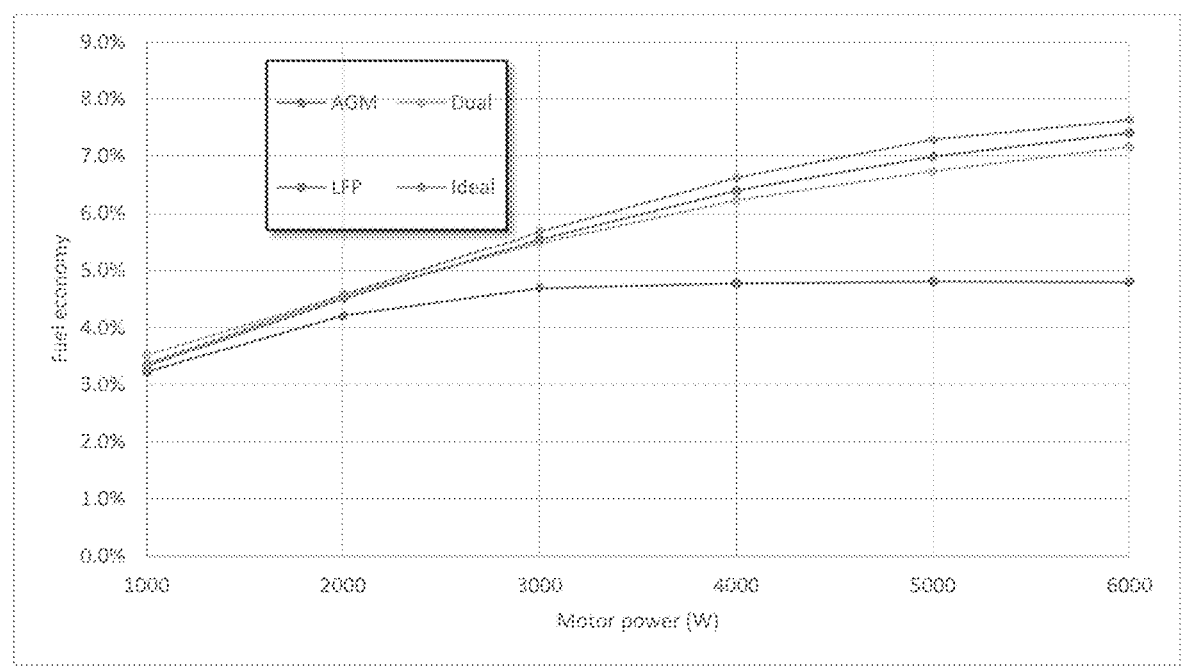

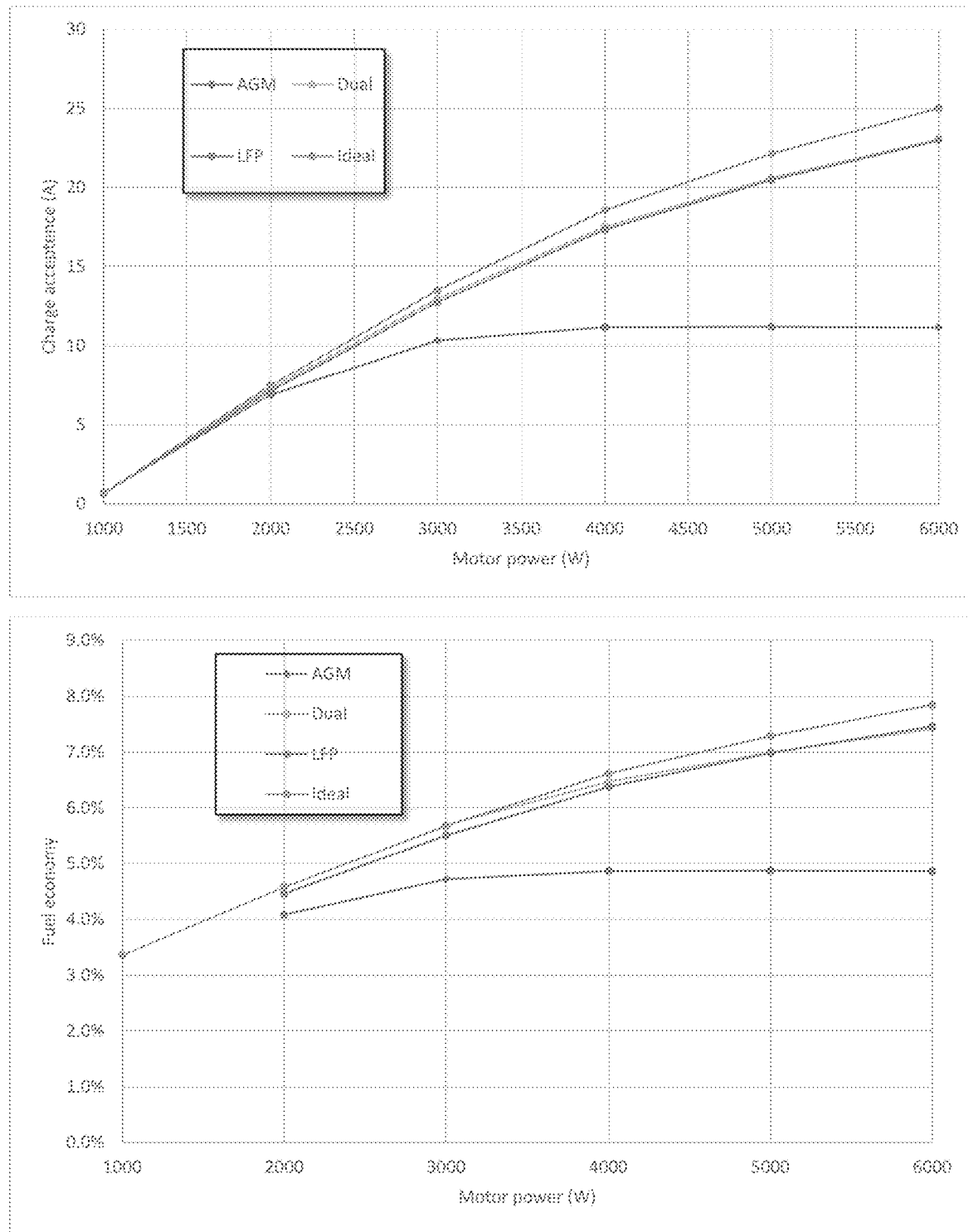
Figure 9: Performance comparison of battery solutions for NEDC with 800W.

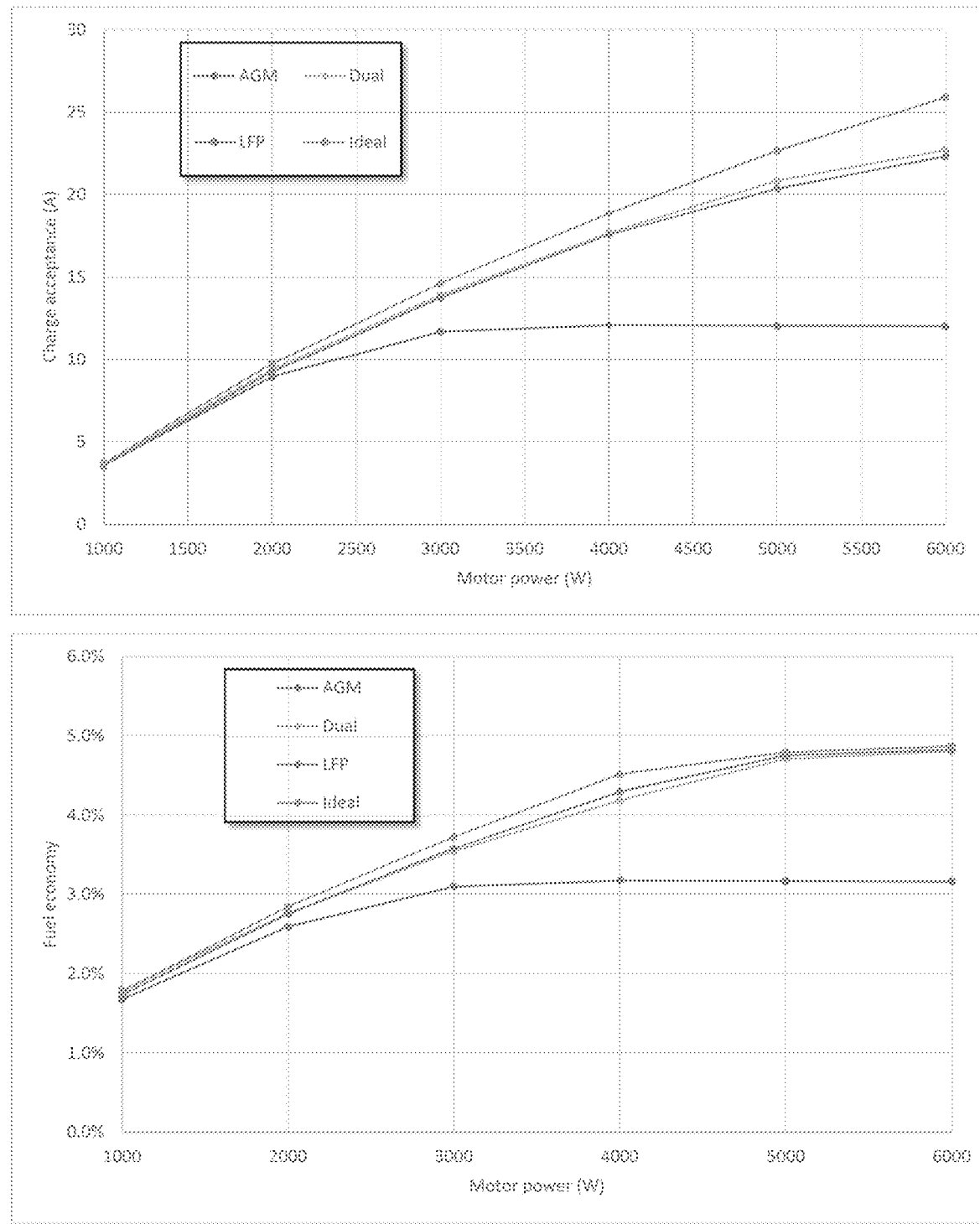
Figure 10: Performance comparison of battery solutions based on US CAFÉ standard with 400W electrical load.

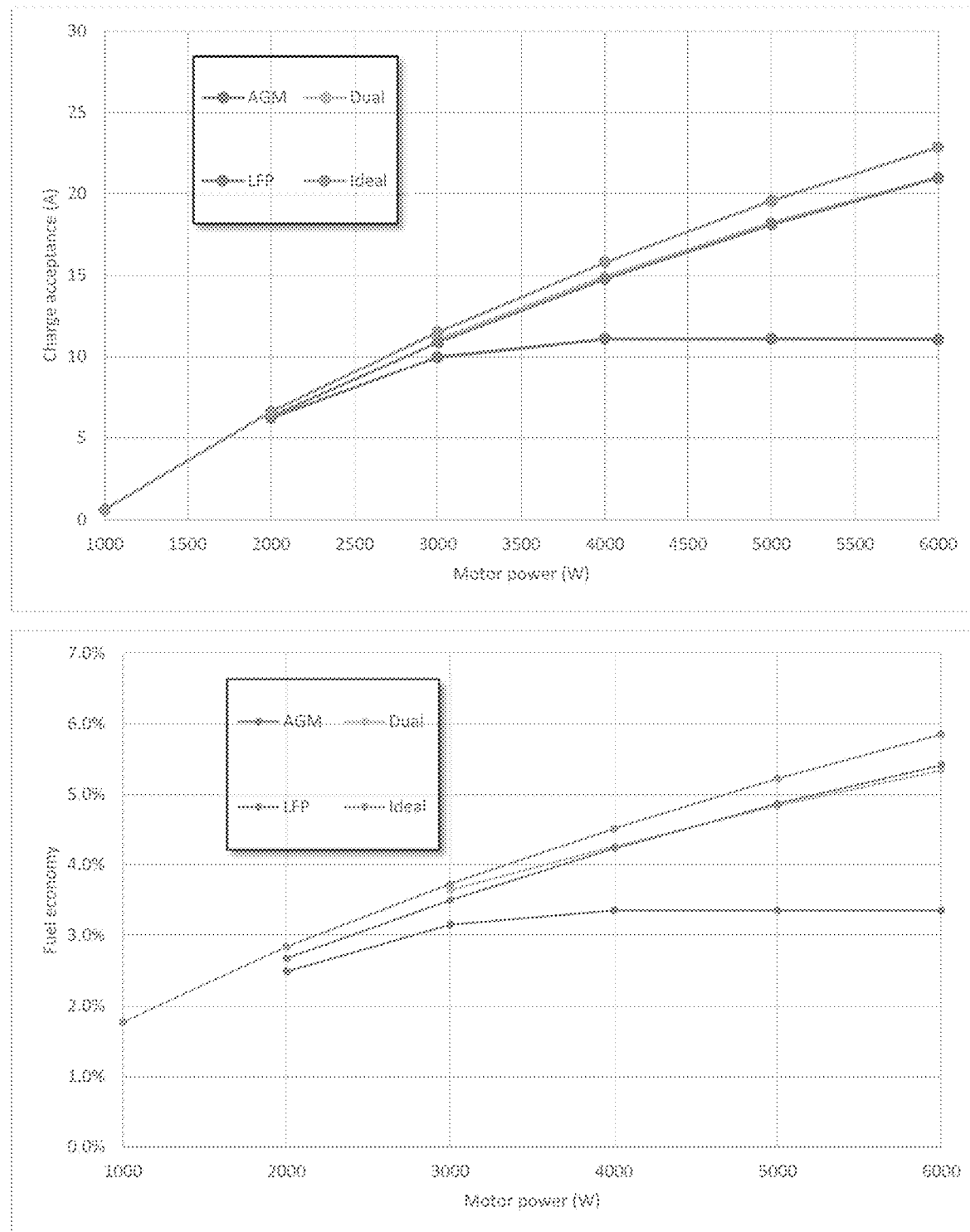
Figure 11: Performance comparison of battery solutions based on US CAFÉ standard with 800W electrical load.

BATTERY SIMULATION MODULE, AND BATTERY ANALYSIS TOOL FOR DETERMINING A BATTERY SOLUTION USING A BATTERY SIMULATION MODULE

CROSS-REFERENCE TO RELATED APPLICATIONS

This application is a continuation application of U.S. patent application Ser. No. 16/179,571, filed Nov. 2, 2018, now U.S. Pat. No. 10,752,126; which claims the benefit of U.S. Provisional Patent Application No. 62/580,745, filed Nov. 2, 2017; all of which are incorporated herein by reference.

FIELD

Battery performance varies by the particular demands that a vehicle places on it causing different battery performance characteristics associated to different vehicles. Determining optimal battery performance, or optimal battery solution, for a given vehicle, or class of vehicles, becomes complicated with the numerous types and applications of power demands for those vehicles. Modeling design processes have advanced in sophistication in attempting to replicate actual vehicle environments for battery usage, but generally fail to provide sufficient equivalence. Addressing this lack of equivalence, a methodology facilitating an accelerated design process of integrating batteries to vehicles is provided based on (1) separating vehicle simulation and battery modeling and (2) combining vehicle and battery parameters within an integration platform. In particular, a modularized vehicle simulation tool implements a 12 V advanced start-stop vehicle battery solution.

BACKGROUND OF THE INVENTION

The advantages of vehicle electrification of 12 V automotive systems is appealing to automotive manufacturers. Although fuel economies of 12 V electrification are generally not directly applicable to 48 V and high voltage hybrid automotive systems, total fuel savings are potentially significant based on the large quantity of conventional vehicles currently in use today. Standardization of 12 V electrification solutions remains problematic as designs are dependent on both vehicle and battery variables. As such a singular battery solution for all, or most, vehicles does not appear to solve this problem.

To address this need, a module-based simulation tool builds battery parameters based on vehicle demands together with component selection based on control optimization. A model framework includes the connection of different modules and data flows between the different modules.

SUMMARY OF THE INVENTION

A module-based framework evaluates designs of advanced start stop systems, particularly 12 V advanced start stop systems. The framework separates vehicle and battery analysis and uses a power profile to evaluate different designs of the vehicles and batteries. Particularly, the framework can evaluate different battery solutions and compare performances as a function of drive cycles, motor size, and electrical loads. In addition to modeling, actual batteries are tested for the same power inputs for validating performance differences. This framework identifies performance limiting components for determination of the vehicle system component optimization.

BRIEF DESCRIPTION OF THE DRAWINGS

FIG. 1 illustrates a module-based simulation tool for 12 V advanced start stop system design.

FIG. 2 illustrates a Matlab/Simulink interface of the battery simulation module. This module accepts inputs of vehicle status and power request and outputs the current, voltage, SOC for performance evaluation.

FIG. 3 shows the Autonomie software interface showing where parameters are modified to simulate a particular vehicle.

FIG. 4 is a graphical representation of driving profile (WLTP) and power profile. The top graphical representation illustrates the vehicle velocity profile; the middle illustrates the regen power profile generated by Autonomie simulation for VW Golf without electrical loads and cranking; and the bottom illustrates modified power profile by adding constant load of 400 W and cranking pulse.

FIG. 5 is a graphical representation of the results of current, power, and voltage profiles respectively for simulation.

FIG. 6 is a graphical representation of showing the charge acceptance and fuel economy as a function of motor size for different battery solutions based on WLTP driving profiles. The top graphical representation illustrates charge acceptance and the bottom illustrates fuel economy.

FIG. 7 is a graphical representation of simulations of FIG. 6 performed with conditions of 800 W load. The top graphical representation illustrates charge acceptance and the bottom illustrates fuel economy.

FIG. 8 is a graphical representation of how changing driving cycle to NEDC affects the performance of different battery solutions having 400 W electrical loads. The top graphical representation illustrates charge acceptance and the bottom illustrates fuel economy.

FIG. 9 is a graphical representation of how changing driving cycle to NEDC affects the performance of different battery solutions have 800 W electrical loads. The top graphical representation illustrates charge acceptance and the bottom illustrates fuel economy.

FIG. 10 is a graphical representation showing simulation results based on US CAFÉ standard (55% FTP72+45% HWFET) for 400 W electrical loads. The top graphical representation illustrates charge acceptance and the bottom illustrates fuel economy.

FIG. 11 is a graphical representation showing simulation results based on US CAFÉ standard (55% FTP72+45% HWFET) for 800 W electrical loads. The top graphical representation illustrates charge acceptance and the bottom illustrates fuel economy.

DETAILED DESCRIPTION OF THE INVENTION

Referring to the module-based simulation tool for 12 V advanced start stop system design of FIG. 1, in the part of vehicle simulation an "infinite" battery (very big capacity and very small resistance) is used to remove any power limit from the battery. In terms of a 12 V advanced start-stop vehicle, the motor size limits how much free energy the vehicle can get and is a key parameter to choose. Also the electrical loads and its management are key parameters which depends on battery status and have strong effects on performance. In the second module of battery simulation, the battery control strategy and battery model are included. The battery control strategy defines conditions for which the battery will be charged and supports the needed loads. The battery model varies by energy storage solution to be selected.

Additionally, FIG. 2 shows the Matlab/Simulink outline of the battery simulation module. The third part involves the calculation of a few key performance like peak power which determines battery size, SOC swing (Ah throughput) which relates to battery life, and fuel economy which is the benefit the end users will get. As shown in FIG. 2, this module accepts inputs of vehicle status and power request and outputs the current, voltage, SOC for performance evaluation.

In principal, all the parts of simulation and calculations in FIG. 1 can be done is a single simulation environment (model). However, separating the vehicle simulation and battery simulation facilitates the design iterations. For example, an OEM asks battery suppliers to come up with suggestions for battery solutions (chemistry and size) for a particular vehicle, which includes the power requests as to a particular performance scenario or numerous critical performance scenarios) of interest to the OEM. Different battery suppliers will use the same power profiles to evaluate their solutions and feed back to the OEM regarding the performance. In another example once the battery is selected, the OEM may desire electrical loads to be transferred to the battery instead of using traditional alternator and optimize the loads management. In this situation the OEM may desire that the battery supplier provide their battery model and focus on investigation of electrical loads managements and calibrating the battery charging/discharging strategy. The Simulink interface shown in FIG. 2 shows how the battery module works. The battery module accepts power requests and vehicle status and outputs the simulated current, voltage, and SOC for performance characterization module.

Battery solution evaluations for 12 V advanced start stop vehicles are a particular case. To demonstrate the functions of module-based simulation tool previously described, the simulation of a few battery solutions for a given power profile and compare the performance in terms of fuel economy and charge acceptance is provided.

Vehicle Selection and Parameters

An Autonomie 2015 version as the simulation tool and simulated a 2017 Volkswagen Golf was used. The parameters are listed in Table 1 which is collected from public sources. FIG. 3 shows the software interface demonstrating where the parameters are modified to reflect a particular vehicle. Note that we have used an "infinite" battery during simulation and the electrical loads was set to zero.

TABLE 1

Vehicle parameters of 2017 VW Golf.

| Weight (lbs) | 3023 | Tire radius (m) | 0.31 |
|---|---|---|---|
| Drag coefficient | 0.29 | Final drive | 3.87 |
| Front area (m²) | 2.59 | Gear ratio (6 levels) | 4.46-0.67 |
| Engine power (hp) | 170 | Motor power (kW) | 1-6 |

FIG. 3: the Autonomie software interface showing where parameters are modified to simulate a particular vehicle.

Four driving profiles were simulated: NEDC, WLTP, FTP72, and HWFET. Table 2, below, shows the characteristics of the four driving profiles. Of note was that the sum of idle time and regen energy vary with driving cycles which affect the fuel economy. Also the available regen energy varies with motor size.

TABLE 2

Driving cycle characteristics

|  | WLTP | NEDC | FTP72 | HWFET |
|---|---|---|---|---|
| Duration(s) | 1800 | 1180 | 1369 | 764 |
| Distance(km) | 23.07 | 10.99 | 11.84 | 16.50 |
| Number of stops | 8 | 13 | 16 | 1 |
| Idle time(s) | 206 | 240 | 207 | 0 |
| Total regen energy(Wh) | | | | |
| Motor = 1 kW | 68.2 | 32.4 | 45.5 | 12.7 |
| Motor = 2 kW | 122.6 | 61.4 | 84.5 | 23.1 |
| Motor = 3 kW | 168.8 | 87.0 | 116.3 | 31.3 |
| Motor = 4 kW | 209.3 | 108.4 | 144.6 | 38.0 |
| Motor = 5 kW | 244.7 | 123.4 | 169.7 | 44.0 |
| Motor = 6 kW | 274.7 | 135.8 | 191.3 | 49.4 |

As an example, a simulated power profile (WLTP and motor power=3 kW) is shown in FIG. 4 where the top one shows vehicle speed profile (WLTP). As shown in FIG. 4, driving profile (WLTP) and power profile with (top) the vehicle velocity profile, (middle) regen power profile generated by Autonomie simulation for VW Golf without electrical loads and cranking and (bottom) modified power profile by adding constant load of 400 W and cranking pulse. The middle figure shows vehicle simulated power profile which only contains the regen profile since electrical load is set to zero. The bottom figure in FIG. 4 shows modified power profile with adding a constant electrical load of 400 W and cranking pulse. The bottom profile will feed to battery simulation for battery evaluations.

Considerations of battery solutions selection and parameters were exemplified considering a variety of battery solutions for 12 V advanced start stop vehicles currently in use. The comparison of three solutions included:

1) Stand-alone AGM H6 (70 Ah)

2) Dual batteries of AGM H6 (70 Ah) and LTO (10 Ah) that are passively parallelized.

3) Stand-alone LFP (69 Ah)

For all batteries involved (four chemistries) an equivalent circuit model (RRC) was used. To obtain model parameters, HPPC tests are performed and then model parameters are obtained by fitting as function of temperature and SOC. Although limited to room temperature performance other variables are contemplated, and other model parameters may be distinct. Tests on battery batteries (cells) are representative of the model provided, and other distinct results may result from a product. For each battery solution some mechanical resistance was added to reflect different architectures of battery solutions listed in Table 3.

For battery control strategy, specifically the charging strategy, the operating SOC (or voltage) need to be defined which varies with chemistry. Table 3 also includes the variables related to control strategy. For lead acid, the target SOC is 80% and for LFP it is 90% SOC. With dual batteries it is voltage controlled and set at 13 V.

TABLE 3

Battery mechanical resistance and control variables.

| Variables | AGM H6 | Dual | LFP |
|---|---|---|---|
| Mechanical resistance (mΩ) | 0 | LTO: 1.0 AGM: 2.0 | 0.5 |
| Top voltage (V) | 14.8 | 14.8 | 14.8 |
| Target SOC | 80% | | 90% |
| Operating voltage (V) | / | 13 | / |

Performance characterization may utilize a method of charge acceptance and fuel economy to characterize performance of each battery solution. For charge acceptance a total accepted charge may be used, such as (integral of charging current) divided by driving cycle time as a criteria.

For 12 V advanced start stop, vehicle fuel economy is improved by start stop function and regen function. To estimate the fuel economy firstly the fuel saved by start stop function is calculated by equation 1, below.

$$GPM_{saved\_SS} = \frac{f_{idle}D(t_{stop} - 10s \cdot (n-1))}{d} \quad (1)$$

Where $f_{idle}$ is the fuel consumption when engine is at idle state which is set as $2.51 \times 10^{-5}$ gal/s/L.
D is the engine size (1.8 L). $t_{stop}$ is the vehicle stop time in seconds and n is the number of starts.
d is the driving distance in mile.
Then to estimate the fuel saved by regen function, the motor energy which is used to support electrical load is calculated by equation 2, below.

$$E_{Motor} = \int_0^{\Delta t} (\text{Load}(W) + P_{bat}(t))dt \quad (2)$$

$P_{bat}(t)$ is the battery power. It is negative when it discharges (supporting loads) and positive when it is charged (motor charges battery and supports loads). Note that equation 1 is only valid when the battery initial SOC is equal to end or final SOC. During battery simulation we have tuned initial. SOC to achieve neutrality so that we can use the above equation to estimate fuel economy. Then the saved gas, $GPM_{saved\_Regen}$, is calculated by equation 3, below.

$$GPM_{saved\_Regen} = \frac{\text{Load}(W) * \Delta t - E_{Motor}}{\rho_{gas} \cdot \eta \cdot d} \quad (3)$$

Where $\rho_{gas}=3.4 \times 10^4$ Wh/Gal, is the energy density of gas, η is the energy conversion efficiency from gas to electricity, which is assumed to be 27%. And d (miles) is the vehicle traveled distance for driving profile. From equation 3 one can see that the saved gas is limited by accessory loads, After $GPM_{saved\_SS}$ and $GPM_{saved\_Regen}$ are obtained by equation 1 and 3, we use the following equation to calculate mile per gallon with advanced start stop function, $MPG_{new}$.

$$MPG_{new} = \frac{1}{GPM_{baseline} - GPM_{saved\_SS} - GPM_{saved\_Regen}} \quad (4)$$

In which $GPM_{baseline}$ is the gallon per mile for vehicle without advanced start stop function which equals $1/MPG_{baseline}$. We have used $MPG_{baseline}=25$ for city and $MPG_{baseline}=35$ for highway. Finally the fuel economy (FE) is calculated by comparing $MPG_{new}$ and $MPG_{baseline}$.

The simulation results of two typical cases are presented below:
A) Driving cycle=WLTP, Motor=3 kW, AGM H6
B) Driving cycle=WLTP, Motor=3 kW, Dual batteries of AGM H6 and NMC/LTO.

As seen in FIG. 5 (from top to bottom) the results of current, power, and voltage profiles are provided. The current and power profiles of FIG. 5 show that the dual battery solution has much higher charge acceptance as demonstrated by higher currents (power) during braking and supports longer the loads during stop. The reason is that the dual solution has much lower charge resistance as demonstrated by the voltage profile where dual battery solution has much smaller voltage swing. A charge neutral was kept so that the fuel economy calculated by equations 1-4 has a fair comparison.

FIG. 6 shows the charge acceptance and fuel economy as a function of motor size for different battery solutions based on WLTP driving profiles. Note that the ideal case is also presented in FIG. 6 where the ideal means a constant voltage (set as 13 V) battery with zero resistance. The ideal battery represents the best performance the system can get based on the inputs of vehicle setup except the battery. FIG. 6 shows that both charge acceptance and fuel economy increases with motor size due to increase of available regen energy from the motor. However, all of them reach a certain limit. AGM H6 reaches a 3.7% fuel economy limit starting from 3 kW. The other three systems reach 5% fuel economy starting from 4 kW. The reasons are however different. For lead acid it is the charge resistance that limits its performance as FIG. 5 has shown. At 3 kW the battery has reaches top voltage and not able to accept higher regen power. However for the other three systems, the electrical load of 400 W is limiting and not the battery resistance. Note that we have performed charge neutral simulations to get the true fuel economy. The vehicle can provide more regen and battery can accept more regen. However, due to limitation of usage, there is not more fuel economy benefit.

To verify electrical load is limiting the performance, the same simulations are performed with conditions of 800 W load. The charge acceptance and fuel economy results are presented in FIG. 7. As can be seen, the three systems (Dual, LFP, Ideal) all have no limitations anymore and fuel economy increases to as high as 6%. However, the lead acid is still limited by its poor charge acceptance (high charge resistance).

FIGS. 8 and 9 shows how changing driving cycle to NEDC affects the performance of different battery solutions. Simulations in FIG. 8 has 400 W electrical loads and simulations of FIG. 9 has 800 W. Comparing with WLTP systems one can see that:
1) For different battery solutions NEDC shows similar trends as WLTP, however it has higher fuel economy due to longer stop time.
2) Increasing the load from 400 W to 800 W does not cause much change in both fuel economy and charge acceptance because NEDC has less regen than WLTP and then electrical load is not a limiting factor anymore.

FIGS. 10 and 11 show the simulation results based on US CAFE standard (55% FTP72+45% HWFET) for 400 W and 800 W respectively. The US CAFE results are similar with WLTP results. At high motor size the performance is somewhat limited by electrical loads.

Table 4, below, summarizes the fuel economy benefit for different battery solutions depending on driving cycles and electrical loads. A start-stop baseline is also presented. The baseline only reflects engine stop at rest and does not include regen braking. As seen in Table 4:
1) A simple start stop application without regen certainly limits the AGM capability to achieve higher fuel economy.
2) There is a gap between lead acid and lithium ion solution due to lower charge acceptance of AGM. However, when the electrical load are small, the gap between AGM and lithium ion solution are small.

TABLE 4

Fuel economy comparison of different battery solutions.

| Optimal FE | | SS baseline | AGM | Dual | LFP | Ideal |
|---|---|---|---|---|---|---|
| WLTP | 400 W | 1.1% | 3.7% | 4.8% | 5.0% | 5.0% |
|  | 800 W |  | 3.6% | 5.9% | 6.0% | 6.6% |
| NEDC | 400 W | 2.0% | 4.7% | 7.2% | 7.4% | 7.6% |
|  | 800 W |  | 4.7% | 7.4% | 7.5% | 7.8% |
| US | 400 W | 0.6% | 3.1% | 4.8% | 4.8% | 4.9% |
| CAFE | 800 W |  | 3.1% | 5.3% | 5.4% | 5.9% |

The 12 V advanced start stop systems can offer 5-8% fuel economy improvement over a conventional vehicle. Although the fuel economy is not as high as those of mild to full hybrids, its low implementation cost makes it an attractive electrification solutions for vehicles. As a result, the 12 V advanced start stop technology has been evolving fast in recent years.

On one hand, battery suppliers are offering a variety of energy storage solutions such as stand-alone lead acid, stand-alone LFP/Graphite, dual batteries of lead acid parallel with NMC/LTO, LMO/LTO, NMC/Graphite, and capacitors, etc. For dual battery solutions, the architecture also varies from passive parallel connection to active switching. On the other hand, OEM are considering to leverage a lot more use out of traditional 12 V SLI (start, light, and ignition) for functions such as power steering, air conditioning, heater, etc. Depending on battery architecture and vehicle functioning design, the energy management strategy can easily become complicated.

Since many variables are involved in the design of 12 V advanced start stop systems, an integrated simulation tool with a couple of modularized models including vehicle, batteries, and performance characterization have been developed. The modularized tool would help to evaluate many aspects of the design from motor size selection, power network management, battery evaluation, testing standardization. As a specific demonstration, in this work, we use the tool to compare three chemistries: stand-alone AGM, stand-alone LFP, and dual batteries of lead acid and LTO for different driving cycles including NEDC, WLTP, FTP72, and HWFET as function of motor size.

References to relative positions (e.g., "top" and "bottom") in this description are merely used to identify various elements as are oriented in the Figures. Orientation of particular components may vary greatly depending on the application in which they are used. For purposes of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature. Construction and arrangement of the system, methods, and devices as shown in the various examples of embodiments is illustrative only. Although only a few embodiments are described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied (e.g. by variations in the number of engagement slots or size of the engagement slots or type of engagement). The order or sequence of any algorithm, process, or method steps may be varied or re-sequenced according to alternative embodiments. Likewise, some algorithm or method steps described may be omitted, and/or other steps added. Other substitutions, modifications, changes and omissions may be made in the design, operating conditions and arrangement of the various examples of embodiments without departing from the spirit or scope of the present inventions.

While this invention has been described in conjunction with the examples of embodiments outlined above, various alternatives, modifications, variations, improvements and/or substantial equivalents, whether known or that are or may be presently foreseen, may become apparent to those having at least ordinary skill in the art. Accordingly, the examples of embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The technical effects and technical problems in the specification are exemplary and are not limiting. It should be noted that the embodiments described in the specification may have other technical effects and can solve other technical problems. Aspects of the method described herein are implemented on a software system running on a computer system. To this end, the methods and system may be implemented in, or in association with, a general-purpose software package or a specific purpose software package. As a specific, non-limiting example, the device could be a battery tester in communication with a cloud storage database and/or mobile device and/or a computer. As another specific, non-limiting example, the device could be a battery tester in communication with a cloud storage database and/or mobile device and/or an OBD-II reader.

The software system described herein may include a mixture of different source codes. The system or method herein may be operated by computer-executable instructions, such as but not limited to, program modules, executable on a computer. Examples of program modules include, but are not limited to, routines, programs, objects, components, data structures, and the like which perform particular tasks or implement particular instructions. The software system may also be operable for supporting the transfer of information within a network.

While the descriptions may include specific devices or computers, it should be understood the system and/or method may be implemented by any suitable device (or devices) having suitable computational means. This may include programmable special purpose computers or general-purpose computers that execute the system according to the relevant instructions. The computer system or portable electronic device can be an embedded system, a personal computer, notebook computer, server computer, mainframe, networked computer, workstation, handheld computer, as well as now known or future developed mobile devices, such as for example, a personal digital assistant, cell phone, smartphone, tablet computer, mobile scanning device, and the like. Other computer system configurations are also contemplated for use with the communication system including, but not limited to, multiprocessor systems, microprocessor-based or programmable electronics, network personal computers, minicomputers, smart watches, and the like. Preferably, the computing system chosen includes a processor suitable for efficient operation of one or more of the various systems or functions or attributes of the communication system described.

The system or portions thereof may also be linked to a distributed computing environment, where tasks are performed by remote processing devices that are linked through a communication network(s). To this end, the system may be configured or linked to multiple computers in a network including, but not limited to, a local area network, wide area network, wireless network, and the Internet. Therefore, information, content, and data may be transferred within the network or system by wireless means, by hardwire connection, or combinations thereof. Accordingly, the devices described herein communicate according to now known or future developed pathways including, but not limited to, wired, wireless, and fiber-optic channels.

In one or more examples of embodiments, data may be stored remotely (and retrieved by the application) or may be stored locally on a user's device in a suitable storage medium. Data storage may be in volatile or non-volatile memory. Data may be stored in appropriate computer-readable medium including read-only memory, random-access memory, CD-ROM, CD-R, CD-RW, magnetic tapes, flash drives, as well as other optical data storage devices. Data may be stored and transmitted by and within the system in any suitable form. Any source code or other language suitable for accomplishing the desired functions described herein may be acceptable for use.

Furthermore, the computer or computers or portable electronic devices may be operatively or functionally connected to one or more mass storage devices, such as but not limited to, a hosted database or cloud-based storage. The system may also include computer-readable media which may include any computer-readable media or medium that may be used to carry or store desired program code that may be accessed by a computer. The invention can also be embodied as computer-readable code on a computer-readable medium. To this end, the computer-readable medium may be any data storage device that can store data. The computer-readable medium can also be distributed over a network-coupled computer system so that the computer-readable code is stored and executed in a distributed fashion.

What is claimed is:

1. A battery analysis tool for determining a battery solution for a vehicle, the battery analysis tool comprising:
   a processor; and
   a memory operatively connected to the processor, the memory storing instructions that, when executed by the processor, cause the processor to:
      develop a battery simulation module;
      receive a battery simulation input generated as an output from a vehicle simulation tool;
      perform the battery simulation including
         applying the battery simulation input to the battery simulation module, and
         outputting tint performance characterizations for the battery simulation input;
      repeat developing a battery simulation module and performing the battery simulation with a different battery simulation input, the repeating of developing a battery simulation module and performing the battery simulation with the different battery simulation input result in outputting second performance characterizations;
      compare the first performance characterizations with the second performance characterizations; and
      select a battery solution based on the comparison.

2. The battery analysis tool of claim 1, wherein the battery solution includes a battery chemistry and a battery size.

3. The battery analysis tool of claim 1, wherein the battery simulation module includes a battery module having a battery chemistry, a battery architecture, and a battery parameter.

4. The battery analysis tool of claim 1, wherein the first performance characterizations includes a performance characterization selected from the group consisting of fuel economy, charge acceptance, State of Charge (SoC) swing, ampere hour (Ah) throughput, and peak power.

5. A battery simulation module comprising:
   a processor; and
   a memory operatively connected to the processor, the memory storing instructions that, when executed by the processor, cause the processor to:
      select a battery control strategy from at least once of a battery charging strategy and a battery discharging strategy;
      receive a battery simulation input, wherein the battery simulation input includes a power profile based on a performance scenario applied to a vehicle simulation module, which includes an engine size and an electrical network for a vehicle;
      select a battery model based on the battery selection input; and
      perform a battery simulation, wherein the battery simulation includes:
         applying the battery simulation input to the selected battery model, and
         outputting performance characterizations for the battery model.

6. The battery simulation module of claim 5, wherein the memory further includes instructions to cause the processor to:
   select a second battery control strategy from at least one of a battery charging strategy and a battery discharging strategy;
   perform a second battery simulation that outputs second performance characterizations for the second battery control strategy; and
   compare the performance characterizations to the second performance characterizations.

7. The battery simulation module of claim 5, wherein the memory further includes instructions to cause the processor to:

select a second battery model based on the battery selection input;
perform a second battery simulation that outputs second performance characterizations for the battery model;
compare the performance characterizations to the second performance characterizations; and
select a battery solution from at least one of the battery model and the second battery model based on a result of the comparison.

8. The battery simulation module of claim 7, wherein the battery solution includes a battery chemistry and a battery size.

9. The battery simulation module of claim 5, wherein the battery model includes a battery chemistry, a battery architecture, and a battery parameter.

10. The battery simulation module of claim 5, wherein the power profile includes a vehicle state and a power request.

11. The battery simulation module of claim 5, wherein the performance characterization includes a performance characterization selected from the group consisting of fuel economy, charge acceptance, State of Charge (SoC) swing, ampere hour (Ah) throughput, and peak power.

12. A tool for determining a battery solution for a class of vehicles, the method comprising:
a processor; and
a memory operatively connected to the processor, the memory storing instructions that, when executed by the processor, cause the processor to:
develop a vehicle simulation module by selecting a class of vehicles having a theoretically infinite battery, an engine size, and an electrical network;
receive a driving profile input;
perform a vehicle simulation including:
applying the driving profile input to the vehicle simulation module, and
outputting a power profile being related to a battery simulation input;
develop a battery simulation module, the battery simulation module including:
selecting a battery control strategy, which includes a battery charging strategy and battery discharging strategy, and
selecting a battery model;
receive the battery simulation input generated as the output from the vehicle simulation module, the battery simulation input includes a power profile;
perform the battery simulation including:
applying the battery simulation input to the battery simulation module, and
outputting performance characterizations for the battery simulation input;
repeating the developing a battery simulation module and performing the battery simulation with at least one of a different battery control strategy, a different battery model, or a different battery control strategy, and with a different battery model, wherein the repetition results in second performance characterizations;
compare the performance characterizations with the second performance characterizations; and
select a battery solution based on the comparison, the battery solution including a battery chemistry and a battery size.

13. The tool for determining a battery solution claim 12, wherein the battery model includes a battery chemistry, a battery architecture, and a battery parameter.

14. The tool for determining a battery solution of claim 12, wherein the performance characterizations includes a performance characterization selected from the group consisting of fuel economy, charge acceptance, State of Charge (SoC) swing, ampere hour (Ah) throughput, and peak power.

15. The method of claim 12, wherein selecting an electrical network for the class of vehicles includes selecting loads and management for the loads.

16. The method of claim 12, wherein the driving profile input includes a driving profile for an advanced start-stop vehicle.

* * * * *

UNITED STATES PATENT AND TRADEMARK OFFICE
CERTIFICATE OF CORRECTION

Page 1 of 2

PATENT NO. : 11,571,989 B1
APPLICATION NO. : 16/939311
DATED : February 7, 2023
INVENTOR(S) : Zhang et al.

It is certified that error appears in the above-identified patent and that said Letters Patent is hereby corrected as shown below:

In the Specification

1. In Column 2, Line 42, delete "have" and insert -- that have --, therefor.

2. In Column 3, Line 17, delete "principal," and insert -- principle, --, therefor.

3. In Column 3, Line 25, delete "scenarios)" and insert -- scenarios --, therefor.

4. In Column 3, Line 31, delete "loads" and insert -- load --, therefor.

5. In Column 4, Line 41, delete "exemplified" and insert -- exemplified by --, therefor.

6. In Column 5, in Table 3, Line 8, delete "80% 90%" and insert -- 80% / 90% --, therefor.

7. In Column 5, Line 43, delete "initial." and insert -- initial --, therefor.

8. In Column 5, Line 56, delete "loads," and insert -- loads. --, therefor.

9. In Column 5, Line 57, delete "equation" and insert -- equations --, therefor.

10. In Column 5, Line 67, delete "equals" and insert -- equals to --, therefor.

11. In Column 6, Line 11, delete "show" and insert -- shows --, therefor.

12. In Column 6, Line 16, delete "where" and insert -- whereas --, therefor.

13. In Column 6, Line 35, delete "reaches" and insert -- reached --, therefor.

14. In Column 6, Line 42, delete "not" and insert -- no --, therefor.

Signed and Sealed this
Ninth Day of April, 2024

Katherine Kelly Vidal
*Director of the United States Patent and Trademark Office*

15. In Column 6, Line 51, delete "shows" and insert -- show --, therefor.

16. In Column 6, Line 64, delete "CAFE" and insert -- CAFÉ --, therefor.

17. In Column 6, Line 65, delete "CAFE" and insert -- CAFÉ --, therefor.

18. In Column 7, in Table 4, Line 25, delete "CAFE" and insert -- CAFÉ --, therefor.

In the Claims

19. In Column 10, Line 10, in Claim 1, delete "tint" and insert -- first --, therefor.

20. In Column 10, Line 39, in Claim 5, delete "once" and insert -- one --, therefor.

21. In Column 12, Line 25, in Claim 13, delete "solution" and insert -- solution of --, therefor.